United States Patent
Tatebe et al.

(10) Patent No.: US 10,781,529 B2
(45) Date of Patent: Sep. 22, 2020

(54) ANODIZED FILMS WITH PIGMENT COLORING

(71) Applicant: Apple Inc., Cupertino, CA (US)

(72) Inventors: Masashige Tatebe, Kakogawa (JP); Takahiro Oshima, Tokyo (JP); Jody R. Akana, San Francisco, CA (US); James A. Curran, Morgan Hill, CA (US); Yutaka Nakagishi, Iga (JP); Junichi Katayama, Kyoto (JP); Kenji Hara, Nara (JP); Yasuhiro Ito, Otsu (JP); Ayumi Hongou, Kyoto (JP)

(73) Assignee: APPLE INC., Cupertino, CA (US)

( * ) Notice: Subject to any disclaimer, the term of this patent is extended or adjusted under 35 U.S.C. 154(b) by 146 days.

(21) Appl. No.: 15/333,058

(22) Filed: Oct. 24, 2016

(65) Prior Publication Data

US 2017/0121838 A1    May 4, 2017

Related U.S. Application Data

(60) Provisional application No. 62/249,079, filed on Oct. 30, 2015.

(51) Int. Cl.
*C25D 11/22* (2006.01)
*C25D 11/16* (2006.01)
(Continued)

(52) U.S. Cl.
CPC .............. *C25D 11/22* (2013.01); *C25D 11/08* (2013.01); *C25D 11/10* (2013.01); *C25D 11/12* (2013.01);
(Continued)

(58) Field of Classification Search
CPC ......... C25D 11/22; C25D 11/08; C25D 11/16; C25D 11/10; C25D 11/24; C25D 11/12;
(Continued)

(56) References Cited

U.S. PATENT DOCUMENTS

| 2,231,373 A | 2/1941 | Max |
| 3,382,160 A | 5/1968 | Tahei |
| (Continued) | | |

FOREIGN PATENT DOCUMENTS

| AT | 262714 B | 6/1968 |
| AT | 365245 B | 12/1981 |
| (Continued) | | |

OTHER PUBLICATIONS

Product Data Sheet on titanium dilactate ammonium salt accessed from http://www.sigma-aldrich.com on Jun. 10, 2015.
(Continued)

*Primary Examiner* — James C Yager
(74) *Attorney, Agent, or Firm* — Dorsey & Whitney LLP (57) ABSTRACT

Anodizing techniques for providing highly opaque colorized anodic films are described. According to some embodiments, the methods involve depositing a pigment having a particle diameter of about 20 nanometers or greater into an anodic film. Additionally or alternatively, a barrier layer smoothing operation is used to flatten an interface between the anodic film and underlying metal substrate so as to maximize light reflection off the interface, thereby maximizing light reflected off the pigment that is deposited within pores of the anodic film. The resulting anodic films have an opaque or saturated colored appearance. In some embodiments, the methods involve increasing a thickness of a non-porous barrier layer of the anodic film so as to create thin film interference effects that can add a particular hue to the anodic film. The methods can be used form cosmetically appealing coatings for consumer products, such as housings for electronic products.

7 Claims, 6 Drawing Sheets

(51) Int. Cl.
*C25D 11/24* (2006.01)
*C25F 3/20* (2006.01)
*H05K 5/02* (2006.01)
*H05K 5/04* (2006.01)
*C25D 11/08* (2006.01)
*C25D 11/10* (2006.01)
*C25D 11/12* (2006.01)
*C25D 11/06* (2006.01)
*G06F 1/16* (2006.01)

(52) U.S. Cl.
CPC ............. *C25D 11/16* (2013.01); *C25D 11/24* (2013.01); *C25F 3/20* (2013.01); *H05K 5/0243* (2013.01); *H05K 5/04* (2013.01); *C25D 11/06* (2013.01); *G06F 1/1633* (2013.01); *Y10T 428/131* (2015.01)

(58) Field of Classification Search
CPC ........ C25D 11/06; H05K 5/0243; H05K 5/04; G06F 1/1633; C25F 3/20; Y10T 428/131
See application file for complete search history.

(56) References Cited

U.S. PATENT DOCUMENTS

| | | | |
|---|---|---|---|
| 3,524,799 A | 8/1970 | Dale | |
| 3,798,193 A * | 3/1974 | Parekh et al. | C08F 8/00 204/507 |
| 3,844,908 A | 10/1974 | Matsuo et al. | |
| 3,962,049 A | 6/1976 | Ueki | |
| 4,066,816 A | 1/1978 | Sheasby et al. | |
| 4,251,330 A | 2/1981 | Sheasby et al. | |
| 4,310,586 A | 1/1982 | Sheasby et al. | |
| 4,526,671 A | 7/1985 | Watanabe et al. | |
| 4,606,796 A | 8/1986 | Hanazima et al. | |
| 4,687,551 A | 8/1987 | Furneaux et al. | |
| 4,702,955 A | 10/1987 | Allred et al. | |
| 4,773,717 A | 9/1988 | Pai et al. | |
| 5,066,368 A | 11/1991 | Pasqualoni et al. | |
| 5,124,172 A | 6/1992 | Burrell et al. | |
| 5,167,793 A * | 12/1992 | Jozefowicz | C25D 11/18 205/121 |
| 5,218,472 A | 6/1993 | Jozefowicz et al. | |
| 5,250,173 A | 10/1993 | Jozefowicz | |
| 5,277,982 A | 1/1994 | Jozefowicz | |
| 5,472,788 A | 12/1995 | Benitez-Garriga | |
| 5,510,015 A | 4/1996 | Martinez et al. | |
| 5,800,693 A | 9/1998 | Kakizaki et al. | |
| 5,904,989 A | 5/1999 | Hanggi et al. | |
| 6,027,629 A | 2/2000 | Hisamoto et al. | |
| 6,379,523 B1 | 4/2002 | Takabayashi | |
| 7,173,276 B2 | 2/2007 | Choi et al. | |
| 7,715,086 B2 | 5/2010 | Yamamoto et al. | |
| 7,922,889 B2 | 4/2011 | Critchlow et al. | |
| 8,377,561 B2 | 2/2013 | Binder et al. | |
| 8,665,075 B2 | 3/2014 | Pratt et al. | |
| 8,828,553 B2 | 9/2014 | Khosla | |
| 9,353,454 B2 | 5/2016 | Shen et al. | |
| 9,512,536 B2 | 12/2016 | Tatebe et al. | |
| 9,512,537 B2 | 12/2016 | Tatebe et al. | |
| 2002/0182538 A1 | 12/2002 | Tomita et al. | |
| 2005/0029115 A1* | 2/2005 | Kuo | C25D 11/12 205/328 |
| 2005/0221712 A1 | 10/2005 | Yasui et al. | |
| 2006/0019035 A1 | 1/2006 | Munz et al. | |
| 2008/0213618 A1 | 9/2008 | Critchlow et al. | |
| 2008/0274375 A1 | 11/2008 | Ng et al. | |
| 2009/0247668 A1* | 10/2009 | Sumitomo | B43K 19/02 523/164 |
| 2010/0276288 A1 | 11/2010 | Hovestad et al. | |
| 2010/0328201 A1 | 12/2010 | Marvit et al. | |
| 2011/0060652 A1 | 3/2011 | Morton | |
| 2012/0073973 A1 | 3/2012 | Yamashita et al. | |
| 2013/0078399 A1 | 3/2013 | Yu et al. | |
| 2013/0081952 A1 | 4/2013 | Akimoto et al. | |
| 2013/0153428 A1 | 6/2013 | Akana et al. | |
| 2013/0153429 A1 | 6/2013 | Khosla | |
| 2013/0168253 A1 | 7/2013 | Mardilovich et al. | |
| 2013/0192588 A1 | 8/2013 | Ostermann | |
| 2013/0328762 A1 | 12/2013 | McCulloch et al. | |
| 2014/0076600 A1 | 3/2014 | Browning et al. | |
| 2014/0193607 A1 | 7/2014 | Browning et al. | |
| 2014/0209467 A1 | 7/2014 | Miao et al. | |
| 2014/0262790 A1 | 9/2014 | Levendusky et al. | |
| 2015/0016030 A1 | 1/2015 | Browning et al. | |
| 2015/0090598 A1 | 4/2015 | Tatebe et al. | |
| 2015/0176146 A1 | 6/2015 | Browning et al. | |
| 2015/0277097 A1 | 10/2015 | Hong et al. | |
| 2015/0368823 A1 | 12/2015 | Curran et al. | |
| 2016/0312374 A1 | 10/2016 | Duffy et al. | |
| 2017/0016136 A1 | 1/2017 | Yamamoto et al. | |
| 2017/0044684 A1 | 2/2017 | Tatebe et al. | |
| 2017/0121836 A1 | 5/2017 | Tatebe et al. | |
| 2017/0121837 A1 | 5/2017 | Tatebe et al. | |

FOREIGN PATENT DOCUMENTS

| | | |
|---|---|---|
| CH | 221939 A | 6/1942 |
| CN | 102834551 | 7/2015 |
| DE | 2262426 A1 | 7/1973 |
| DE | 102008011298 A1 | 9/2008 |
| EP | 975827 B9 | 7/2003 |
| EP | 2589686 | 5/2013 |
| EP | 2649224 B1 | 3/2016 |
| EP | 1432849 B1 | 5/2016 |
| EP | 3017093 A1 | 5/2016 |
| EP | 3017094 | 5/2016 |
| JP | 52087364 A | 7/1977 |
| JP | 57092194 A | 6/1982 |
| JP | S5792194 A | 6/1982 |
| JP | S6220896 A | 1/1987 |
| JP | S62263996 A | 11/1987 |
| JP | H06200399 A | 7/1994 |
| JP | 09143795 A | 6/1997 |
| JP | 11001797 A | 1/1999 |
| JP | 2005060720 A | 3/2005 |
| JP | 2006057493 A | 3/2006 |
| JP | 2007314840 A | 12/2007 |
| JP | 2007325995 A | 12/2007 |
| JP | 2008223073 A | 9/2008 |
| JP | 2009248485 A | 10/2009 |
| JP | 2009256778 A | 11/2009 |
| JP | 2015161012 A | 9/2015 |
| TW | I496955 B | 8/2015 |
| WO | 1991002830 | 3/1991 |
| WO | 1992019795 | 11/1992 |
| WO | 1992019795 A1 | 11/1992 |
| WO | 2001018281 A1 | 3/2001 |
| WO | 2012119306 A1 | 9/2012 |
| WO | 2015047634 A1 | 4/2015 |
| WO | 2015047635 | 4/2015 |
| WO | 2015047635 A1 | 4/2015 |
| WO | 2015199639 A1 | 12/2015 |
| WO | 2016005649 A1 | 1/2016 |

OTHER PUBLICATIONS

International Search Report & Written Opinion—Application No. PCT/US2014/043601 dated Apr. 29, 2015.
Gils. S. V. et al., "Colour properties of barrier anodic oxide films on aluminum and titanium studied with total reftextance and spectroscopic ellipsometry." Surface & Coatings Technology, vol. 185, pp. 303-310 (2004).
Shin, T. S. et al., "Optical properties of anodic aluminum oxide films on A11050 alloys," Surface & Coatings Technology, vol. 202, pp. 3298 3305 (2008).
Parkhutik et al. Theoretical Modelling of Porous Oxide Growth on Aluminum J. Phys. D: Appl. Phys. 25, pp. 1258-1263 (1992).
International Search Report & Written Opinion—Application No. PCT/US2014/052843, dated Dec. 11, 2014.
Grubbs, Charles A., "Anodizing of Aluminum" Houghton Metal Finishing, Alpharetta, GA. Jan. 2001, p. 476-493.

(56) References Cited

OTHER PUBLICATIONS

PCT Patent Application No. PCT/US2016/058529—International Search Report and Written Opinion dated Aug. 30, 2017.
Taiwanese Patent Application. No. 105216517—Technical Evaluation Report dated May 8, 2018.
Chinese Application for Invention No. 201480047233.5—Third Office Action dated Jun 21, 2018.
Nissa, J .; "Fabrication of a Porous Alumina Membrane", 2013, Master's Thesis submitted to Lund University, p. 13-19.
ASTM, Designation: D 1141-98 (Re-approved 2003) Standard Practice for the Preparation of Substitute Ocean Water, 2003, p. 1-3.
ASTM, Designation: B117-18 Standard Practice for Operating Salt Spray (Fog) Apparatus, 2018, p. 1-12.
Japanese Patent Application No. 2016-544340—Office Action dated Jan. 27, 2017.
Taiwanese Patent Application. No. 103129614—Office Action dated Jun. 22, 2015.
European Patent Application No. 14848872.9—Extended European Search Report dated Apr. 19, 2017.
Database WPI, Week 198228 Thomson Scientific, London, GB; AN 1982-58655E-& JP S57 92194 A (Nippon Light Metal Co) Jun. 8, 1982.
German utility model application 20 2016 006 606.5—Extended Search Report dated Mar. 7, 2017.
F. Ostermann: Application Technology Aluminum. Berlin Heidelberg: Springer-Verlag, 1998.—ISBN 978-3-662-05789-6, pp. 113-114, chapter 5.2.1 1, 2, 6, and table 5.2.1 and pp. 9, 10, 14 526-528, chapter 19.4.1. (Concise explanation provided in English, from pp. 1-6.).
Chinese Application Patent Application No. 201480047233.5—Office Action dated Mar. 27, 2017.
Parkhutik et al.; "Theoretical modeling of porous oxide growth on aluminum", Minsk Radioengineering Institute, P. Brovki 6, 220600 Minsk, Belorussia, pp. 1258 to 1263, Mar. 2, 1992.
Australian innovation patent no 2016101931—Examination Report No. 1, dated Dec. 14, 2016.
PCT Patent Application No. PCT/US2017/016478—International Search Report and Written Opinion dated May 12, 2017.
Chinese Application for Invention No. 201480047233.5—Second Office Action dated Dec. 13, 2017.
EasyRGB "Convert color data into different standards and color spaces", p. 1-2; Accessed on Feb. 6, 2019 at https://www.easyrgb.com/en/convert.php#i nputFORM.
Japanese Patent Application No. 2018-521261—Office Action dated Mar. 11, 2019.
Chinese Patent Application No. 201680064003.9—First Office Action dated May 13, 2019.

\* cited by examiner

ANODIZED FILMS WITH PIGMENT COLORING

CROSS-REFERENCE TO RELATED APPLICATIONS

This application claims the benefit of priority under 35 U.S.C § 119(e) to U.S. Provisional Application No. 62/249,079, entitled "ANODIZED FILMS WITH PIGMENT COLORING," filed on Oct. 30, 2015, which is incorporated by reference herein in its entirety. This application is related to U.S. application Ser. No. 14/312,502, entitled "INTERFERENCE COLORING OF THICK, POROUS, OXIDE FILMS," filed on Jun. 23, 2014, which is incorporated by reference herein in its entirety.

Any publications, patents, and patent applications referred to in the instant specification are herein incorporated by reference in their entireties. To the extent that the publications, patents, or patent applications incorporated by reference contradict the disclosure contained in the instant specification, the instant specification is intended to supersede and/or take precedence over any such contradictory material.

FIELD

The described embodiments relate to colored anodized films and methods forming colored anodized films. More specifically, methods involve techniques for providing colored anodized films that are highly opaque.

BACKGROUND

Anodizing is an electrochemical process that thickens a naturally occurring protective oxide on a metal surface. An anodizing process involves converting part of a metal surface to an anodic film. Thus, an anodic film becomes an integral part of the metal surface. Due to its hardness, an anodic film can provide corrosion resistance and wear protection for an underlying metal. In addition, an anodic film can enhance a cosmetic appearance of a metal surface. For example, anodic films have a porous microstructure that can be infused with dyes to impart a desired color to the anodic films.

Conventional methods for coloring anodic films, however, have not been able to achieve an anodic film with an opaque and saturated colored appearance. In particular, the underling metal substrate can often be seen through a dyed anodic film such that the anodized substrate appears to have a slight grey or metallic appearance. Thus, it is not possible to achieve a truly opaque colored anodic film using conventional anodic film coloring techniques—especially when trying to achieve a pure and opaque white color. Rather, conventional techniques for producing white colored films result in films that appear to be off-white, muted grey, or transparent white. These near-white anodic films can appear drab and cosmetically unappealing compared to a desirable pure and opaque white.

SUMMARY

This paper describes various embodiments that relate to colored anodized films and methods for forming colored anodized films. The colored anodized films can have highly opaque appearances, including those having an opaque white colored appearance.

According to one embodiment, a method of coloring an anodic film is described. The anodic film includes a porous layer over a barrier layer. The method includes smoothing an interface surface between the barrier layer and a metal substrate. The method also includes depositing a pigment within pores of the porous layer of the anodic film.

According to another embodiment, a metal article is described. The metal article includes a metal substrate. The metal article also includes an anodic film covering the metal substrate. The anodic film includes a porous layer having pores with pigment infused therein. The anodic film further includes a barrier layer positioned between the porous layer and the metal substrate. An interface surface between the barrier layer and the metal substrate is a sufficiently smooth to direct light incident a top surface of the anodic film toward the pigment within the pores. The bottoms of the pores of the porous layer can also be smooth.

According to a further embodiment, an enclosure for an electronic device is described. The enclosure includes a metal substrate and an anodic film covering the metal substrate. The anodic film includes a porous layer having pores with pigment positioned therein. The anodic film also includes a barrier layer positioned between the porous layer and the metal substrate. The barrier layer has a thickness greater than about 150 nanometers.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Described herein are processes for colorizing anodic films. In particular, methods for increasing the color saturation or intensity of a colorant deposited within the anodic film are described. In some embodiments, the colorant is a pigment having a relatively large particle diameter compared to the particle sizes of conventional dyes. In some cases, the pigment particles each have a particle diameter of about 20 nanometers or greater. In some embodiments, each of the pigment particles has a particle diameter of 50 nanometers or greater. The larger pigment particles can absorb and reflect more incident light and provide a more saturated color to the anodic film compared to dyes having smaller diameters. The constitution of the pigment will depend on a desired color for the anodic film. In some embodiments, titanium oxide (TiO$_2$) pigment is used to provide a white appearance to the anodic film. In some embodiments, a carbon black colorant is used to provide a black appearance to the anodic film. In some cases, the pores of the anodic film are widened prior to infusion of pigment particles in order to accommodate the larger pigment particle sizes. The resultant colored anodic film can have about 1 weight % of colorant or greater—in some cases up to about 30 weight %.

According to some embodiments, the methods involve smoothing an interface surface of a barrier layer within the anodic film. Smoothing can also be described as flattening or creating a more even topology. The barrier layer generally corresponds to a non-porous layer of the anodic film that forms during an anodizing process. The interface surface corresponds to a surface of the barrier layer between the porous layer of an anodic film and the non-porous barrier layer. The interface surface generally has a roughened surface that has a series of scalloped-shaped hemispherical features attributed by the curved pore terminuses of the porous layer. This rough interface surface can trap incident light and prevent some light from reaching the colorant that is deposited within the pores of the anodic film. The methods described herein involve smoothing out the interface surface such that the interface surface reflects incident light onto the colorant. The smoothing process can also smooth out pore terminuses (bottoms of pores) of the porous layer. The smoothing can be accomplished by electrolyzing the anodic film in a solution that does not substantially dissolve the anodic film, but instead promotes smoothing and, in some cases, some growth of the barrier layer. The resultant anodic film can have a richer and more saturated color.

The present paper makes reference to anodizing of aluminum and aluminum alloy substrates. It should be understood, however, that the methods described herein may be applicable to any of a number of other suitable anodizable metal substrates, such as suitable alloys of titanium, zinc, magnesium, niobium, zirconium, hafnium, and tantalum, or suitable combinations thereof. As used herein, the terms anodized film, anodized coating, anodic oxide, anodic oxide coating, anodic film, anodic layer, anodic coating, oxide film, oxide layer, oxide coating, etc. can be used interchangeably and can refer to suitable metal oxide materials, unless otherwise specified.

Methods described herein are well suited for providing cosmetically appealing surface finishes to consumer products. For example, the methods described herein can be used to form durable and cosmetically appealing finishes for housing for computers, portable electronic devices, wearable electronic devices, and electronic device accessories, such as those manufactured by Apple Inc., based in Cupertino, Calif.

These and other embodiments are discussed below with reference to FIGS. 1-5B. However, those skilled in the art will readily appreciate that the detailed description given herein with respect to these Figures is for explanatory purposes only and should not be construed as limiting.

Figure 1:
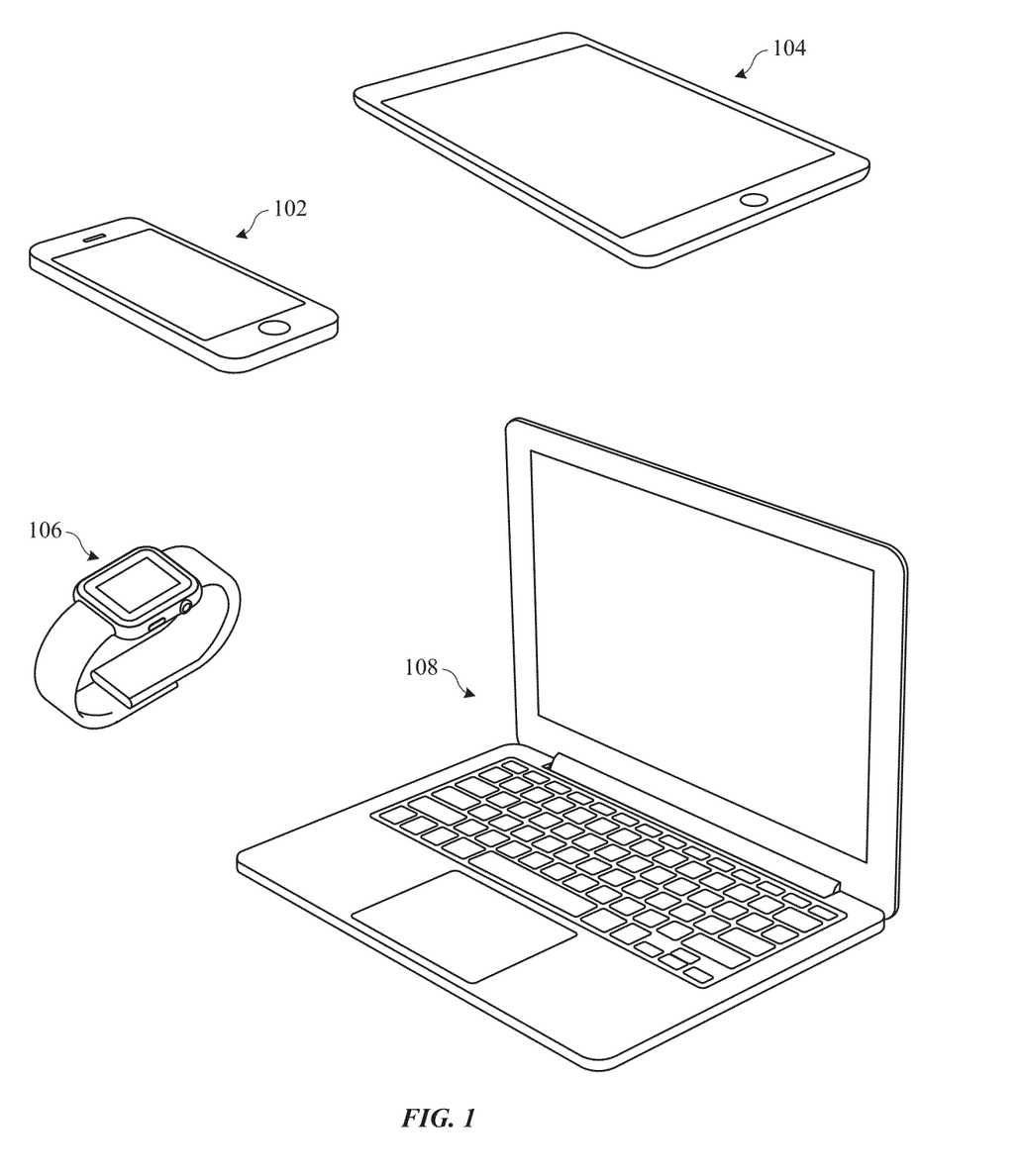
FIG. 1 shows perspective views of devices having metallic surfaces that can be protected using anodic oxide coatings described herein.

The methods described herein can be used to form durable and cosmetically appealing coatings for metallic surfaces of consumer devices. FIG. 1 shows consumer products that can be manufactured using methods described herein. FIG. 1 includes portable phone 102, tablet computer 104, smart watch 106 and portable computer 108, which can each include housings that are made of metal or have metal sections. Aluminum alloys are often a choice metal material due to their light weight and ability to anodize and form a protective anodic oxide coating that protects the metal surfaces from scratches. The anodic oxide coatings can be colorized to impart a desired color to the metal housing or metal sections, adding numerous cosmetic options for product lines.

Conventional anodic oxide coloring techniques involve infusing dyes, such as organic dyes, within the pores of the anodic oxide. Although conventional anodic oxide coloring techniques result in adding a colored finish to the metallic surfaces, the colored finish retains a metallic look. This is because the underlying metal substrate is still observable through the anodic oxide such that the anodic oxide finish has a silver or grey hue. It is difficult or impossible to create a pure colored anodic oxide finish that is not affected by the color of the underlying metal substrate using conventional dyeing techniques. Described herein are coloring techniques that can provide anodic oxide finishes to metal substrate, such as those on housing of devices 102, 104, 106 and 108, having more rich and saturated colors compared to conventional dyeing techniques.

Figure 2:
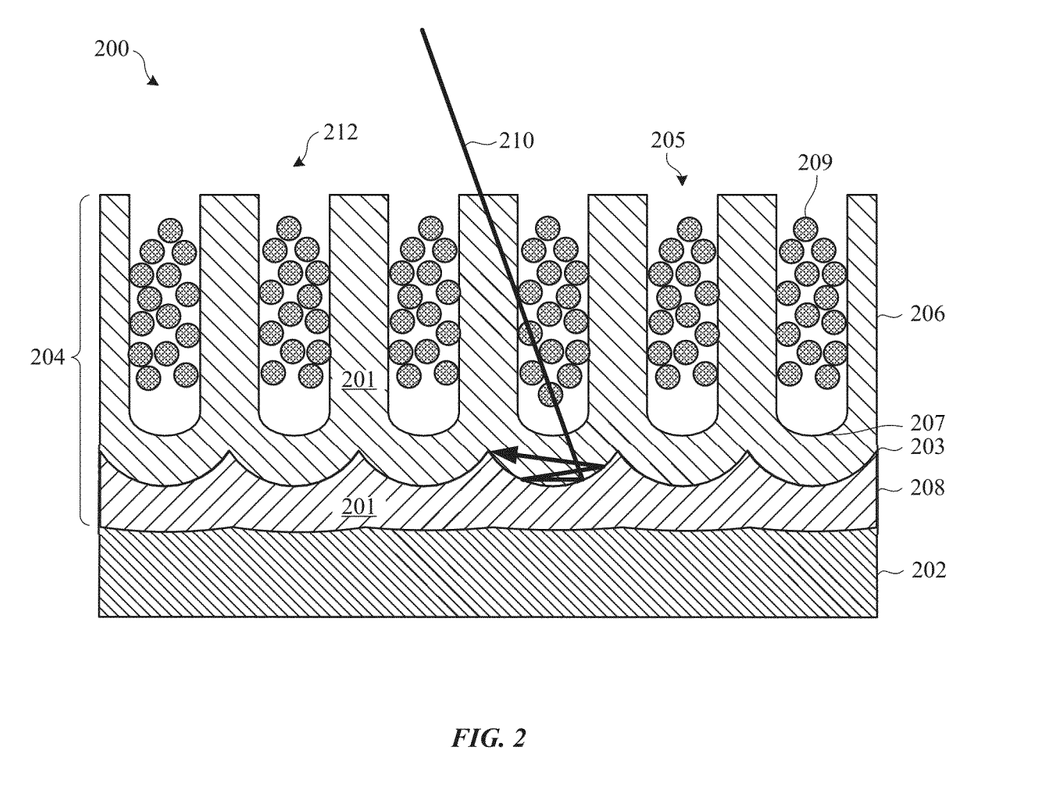
FIG. 2 shows a cross section view of an anodized part illustrating how light can become trapped within a standard colored anodized film.

FIG. 2 illustrates a cross section view of a surface portion of anodized part 200, showing how light can become trapped within a standard colored anodized film 204. Part 200 includes metal substrate 202 and anodic film 204. Anodic film 204 can be formed by an anodizing process, whereby surface portions of metal substrate 202 are converted to corresponding metal oxide material 201. Anodic film 204 includes porous layer 206 and barrier layer 208. Porous layer 206 includes pores 205 that are formed during the anodizing process. Barrier layer 208 corresponds to a non-porous layer positioned between substrate 202 and porous layer 206. Barrier layer 208, like porous layer 206, is made of metal oxide material 201 but does not include pores 205. Interface surface 203 of barrier layer 208 has a shape that is partially defined by pore terminuses 207 of pores 205. In particular, the curved shaped pore terminuses 207 can cause interface surface 203 to have a scalloped geometry or shape. In three dimensions, interface surface 203 can be characterized as having a series of curved, hemispherical, cup-like features.

The size of pores 205 will depend, in part, on the process conditions of the anodizing process. For type II anodizing processes, which involves anodizing in sulfuric acid solution, a typical diameter of pores 205 is on the scale of tens of nanometers—typically less than about 20 nanometers. Pores 205 can be filled with dye particles 209, typically organic dye particles to impart a particular color to anodic film 204 and provide a colored finish to part 200. Dye particles 209 have smaller diameters than the diameters of pores 205 so that dye particles 209 can fit within pores 205.

One of the challenges associated with coloring anodic film 204 is that it can be difficult to accomplish a visibly saturated, rich, highly opaque color. This is because metal oxide material 201 of anodic film 204 can be partially transparent to visible light. Thus, underlying metal substrate 202 can be visible through anodic film 204. This can result in part 200 appearing a particular color from infused dye particles 209 as well as a having a metallic appearance from underlying substrate 202, as viewed from surface 212. This can give part 200 a silver or grey hue, which can be more apparent for lighter shades of dye particles 209.

In addition, light incident anodic film 204 can become trapped within anodic film 204 due to the scalloped shaped interface surface 203 of barrier layer 208. To illustrate, light ray 210 that is incident on anodic film 204 can enter porous layer 206 and be locally scattered by the scalloped features of interface surface 203. This means that light ray 210 cannot not reach and reflect off dye particles 209, and therefore does not contribute to providing a desired color to anodic film 204. That is, light ray 210 becomes trapped within anodic film 204 by the scalloped topology of interface surface 203, thereby darkening the appearance of anodic film 204.

The methods described herein involved using different types of colorant and/or modifying features of anodic film 204 to increase the effectiveness of a colorant that is deposited within pores 205. In some embodiments, the methods involve using a pigment as a colorant instead of a conventional organic or inorganic dye. The pigments can have a larger particle diameter than that of dye particles 209 and provide better coverage of the anodic film. Alternatively or additionally, the methods involve smoothing interface surface 203 of barrier layer 208 to increase the amount of light that reaches dye particles 209 or other type of colorant.

Figure 3A:
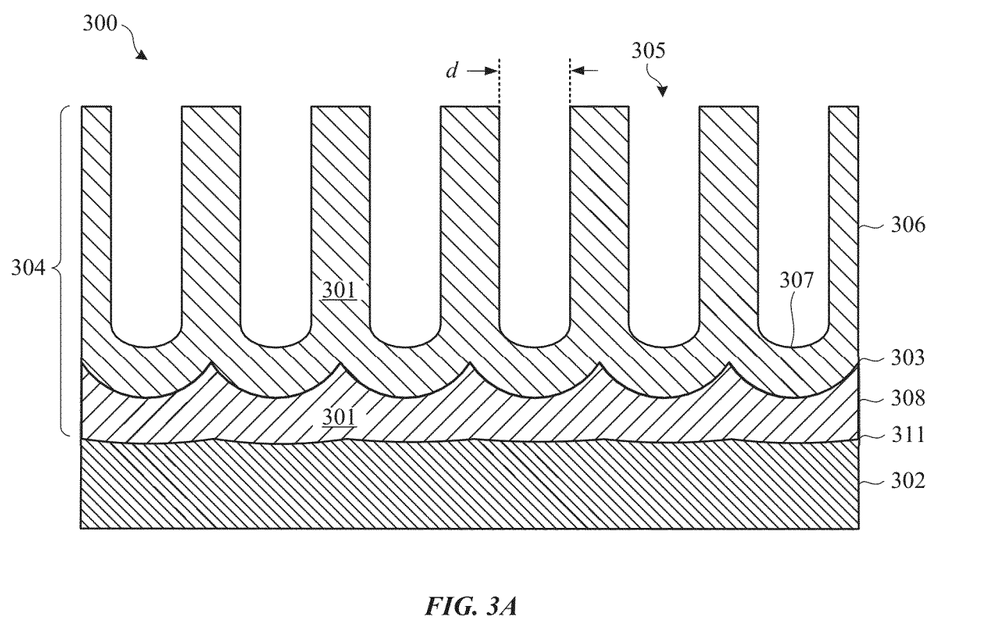
FIGS. 3A-3D show cross section views of an anodized part that is colorized in accordance with some embodiments.

FIGS. 3A-3D illustrate cross section views of a surface portion of part 300 undergoing an anodic film coloration process in accordance with some embodiments. FIG. 3A shows part 300 after an anodizing process, in which a portion of metal substrate 302 is converted to anodic film 304 that includes a corresponding metal oxide material 301. Metal substrate 302 can include an alloy, such as an aluminum alloy, to provide good strength and structural durability. If metal substrate 302 is aluminum or aluminum alloy, metal oxide material 301 includes aluminum oxide.

In some embodiments, the anodizing process is performed in phosphoric acid and/or oxalic acid solution, which can result in anodic film 304 having a wider pores 305 compared to anodizing in sulfuric acid solution (e.g., type II anodizing). Wider pores can accommodate more colorant and larger sized colorant particles, the advantages of which will be described in detail below. Wider pores can also be accomplished by using higher anodizing voltages compared to standard type II anodizing processes. The voltage will vary depending on the type of anodizing solution and other process parameters. In particular embodiments, an applied voltage of greater than 50 volts is used. In one embodiment, a phosphoric acid solution is used and a voltage of about 150 volts is used. It should be noted that anodic film 304 that pores 305 that are too wide, or that have too many pores, could impact the structural integrity of anodic film 304. Thus, these considerations should be balanced when choosing the anodizing process parameters.

Prior to anodizing, a surface treatment can be applied to metal substrate 302. For example, a polishing operation can be used to create a highly reflective surface on metal substrate 302 such that, once anodized, surface 311 of metal substrate 302 retains the highly reflective surface property. In other embodiments, an etching (e.g., acidic or alkaline etching) is used to create a textured surface on metal substrate 302, which can also be retained by surface 311. Advantages of each of these pre-anodizing surface treatments will be described in detail below.

Anodic film 304 includes porous layer 306 and barrier layer 308. Porous layer includes pores 305 while barrier layer 308 is substantially free of pores 305. In some embodiments, a target thickness of the porous layer is between about 6 and 20 micrometers. Barrier layer 308 is positioned between porous layer 306 and metal substrate 302, with interface surface 303 of barrier layer 308 defining the junction region between porous layer 306 and barrier layer 308. Interface surface 303 is defined in part by the shape of pore terminuses 307. Thus, curved pore terminuses 307 can cause interface surface 303 to have a series of scalloped-shaped features, which in three dimensions corresponds to a series of cup-like features. As described above with reference to FIG. 2, this scalloped shaped interface surface 303 can trap incoming light.

Figure 3B:
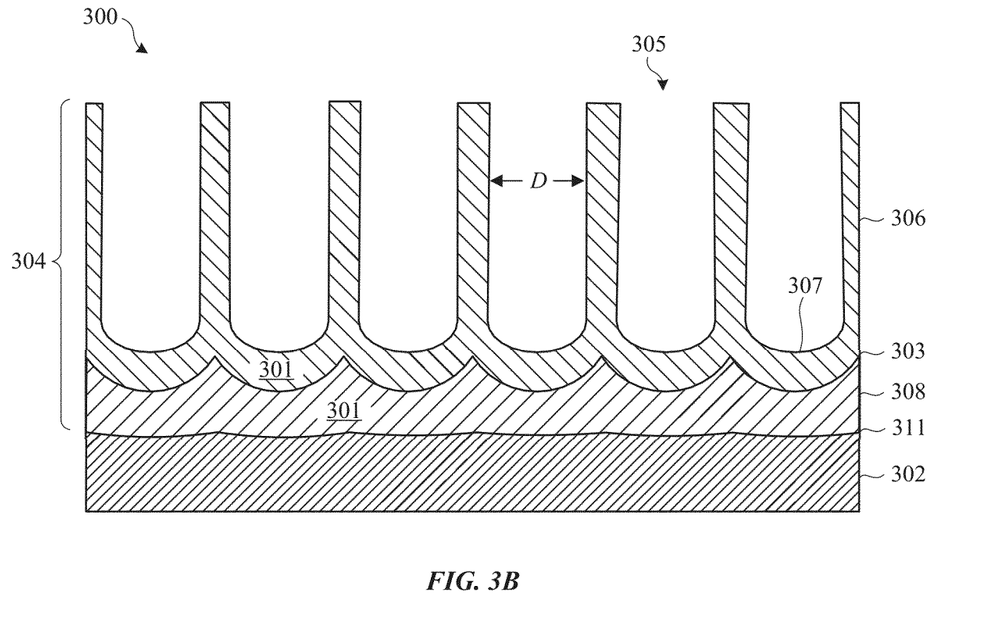

FIG. 3B shows part 300 after an optional pore widening process, in which pores 305 are widened to accept more colorant. In some embodiments, the pore widening process includes exposing anodic film 304 to an electrolytic process in an acidic bath (e.g., phosphoric acid, sulfuric acid, sulfamic acid, oxalic acid) with a relatively weak voltage, which removes some of the metal oxide material 301 around pores 305. In a particular embodiment, a phosphoric acid solution having a concentration of between about 2% and 30% is used. In some embodiments, ultrasonic waves are applied while the voltage is applied. It should be noted, however, that other types of solutions and techniques can also cause widening of pores 305.

The resultant anodic film 304 is characterized as having a pore diameter D that is greater than the pore diameter d prior to the pore widening process. As with the anodizing process described above, a number of factors should be considered as to the extent of widening pores 305. That is, it may be desirable to widen pores 305 as much as possible to accommodate more colorant and thereby increase the relative amount of colorant within anodic film 304. However, widening pores 305 to a very large extent can negatively affect the structural integrity of anodic film 304.

It should be noted that the process conditions of the anodizing process (FIG. 3A) could depend on whether a pore widening process is performed. For example, in a particular embodiment, the anodizing process is performed in an oxalic acid solution (e.g., about 30 g/L to about 50 g/L concentration held at about 20 degrees C. to about 40 degrees C.) using a voltage of about 30V to about 80V. This oxalic acid anodizing process can result in a pore diameter d that is smaller than that using a similar process with a phosphoric acid solution. However, pore widening performed after such an oxalic acid anodizing process can result in the same or wider pore diameter D compared to that of a phosphoric acid anodizing process without a pore widening process. In addition, the oxalic acid anodizing and pore widening process can result in a more structurally sound anodic film 304 compared to that of a phosphoric acid anodizing process without a pore widening process.

Figure 3C:
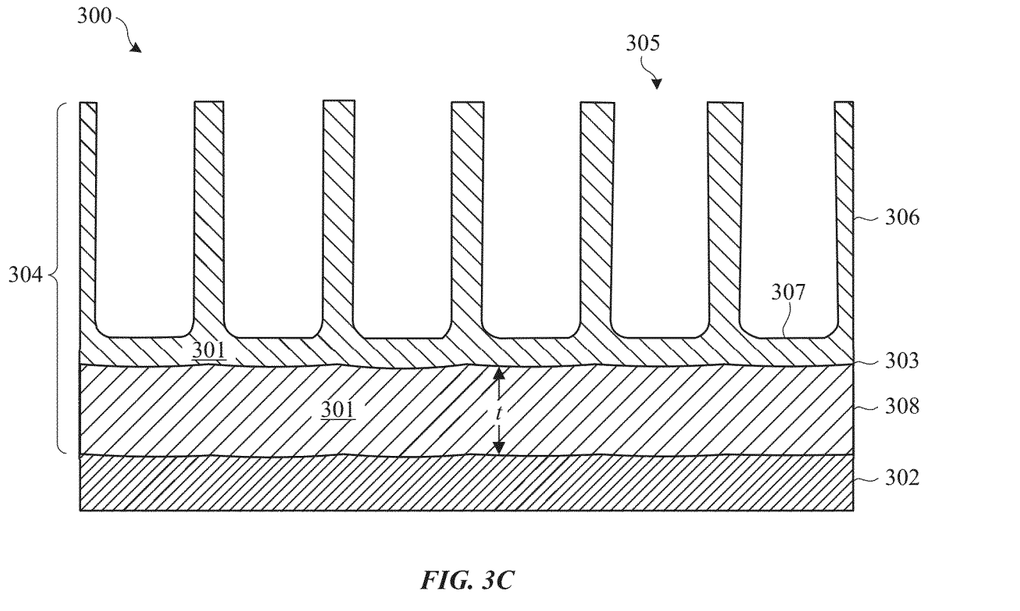

FIG. 3C shows part 300 after a barrier layer smoothing process is performed, in which interface surface 303 of barrier layer 308 is smoothed. In addition, the shape of pore terminuses 307 can be smoothed and flattened compared to the curved shape prior to the smoothing process. In some embodiments, the smoothing process involves exposing part 300 to an electrolytic process where part 300 acts as an anode in a solution that promotes anodic film growth without substantially promoting anodic film dissolution, i.e., a non-pore-forming electrolyte. In some embodiments, the solution contains one or more of sodium borate (borax), boric acid and tartaric acid solution. Other suitable solutions are described below with reference to FIG. 4. In some embodiments, the solution contains between about 10 to 20 g/L of sodium borate and has a pH of about 9. In some embodiments, the solution contains between about 10 and 20 g/L of boric acid and has a pH of about 6. The temperature of the solution can vary. In some embodiments, the solution is held at about 25 degrees Celsius. In some embodiments, an alternating current (AC) of between about 100 and 400 volts is applied. In some embodiments, a direct current (DC) of between about 100 and 200 volts is applied. The voltage can vary depending on other process parameters—in some embodiments the voltage is between about 50 and 400 volts. The result is a flattening or partial flattening of the scalloped projections of interface surface 303.

Similar to an anodizing process, part 300 acts as the anode and a further portion of metal substrate 302 is converted to metal oxide material 301. Thus, the barrier layer smoothing process can be coupled with thickening of barrier layer 308. To some extent, the amount of smoothing of interface surface 303 can be proportion to the amount of thickening of barrier layer 308. The thickness t of barrier layer 308 can be measured using scanning electron microscopy (SEM) images of cross sections samples, which are described below with reference to FIGS. 5A and 5B. In some embodiments, prior to the barrier layer smoothing process, barrier layer 308 has a thickness t of about 110 nanometers or less, and after the barrier layer smoothing process barrier layer 308 has a thickness t of greater than about 150 nanometers. In some embodiments, barrier layer 308 is grown to a thickness t of between about 150 and 500 nanometers. It should be noted that the smoothing process (FIG. 3C) can be performed before or after the pore widening process (FIG. 3B). In some cases, however, the smoothing process is performed after the pore widening process since doing so can result in a smoother barrier layer 308.

The thickening of barrier layer 308 can also be used to some advantage with regard to a final perceived color of anodic film 304 and part 300. For example, the thickness of barrier layer 308 can be tuned to create an interference effect with incoming light, adding a predetermined perceived hue to anodic film 304. Such interference coloration effects are described in detail in application Ser. No. 14/312,502, which is incorporated by reference herein in its entirety. It should be noted that it may be beneficial to use generally higher voltages during electrolytic process when optimizing for smoothness of interface surface 303 compared to the voltages used for tuning a thickness of barrier layer 308 for a particular interference coloring effect described in application Ser. No. 14/312,502.

Figure 3D:
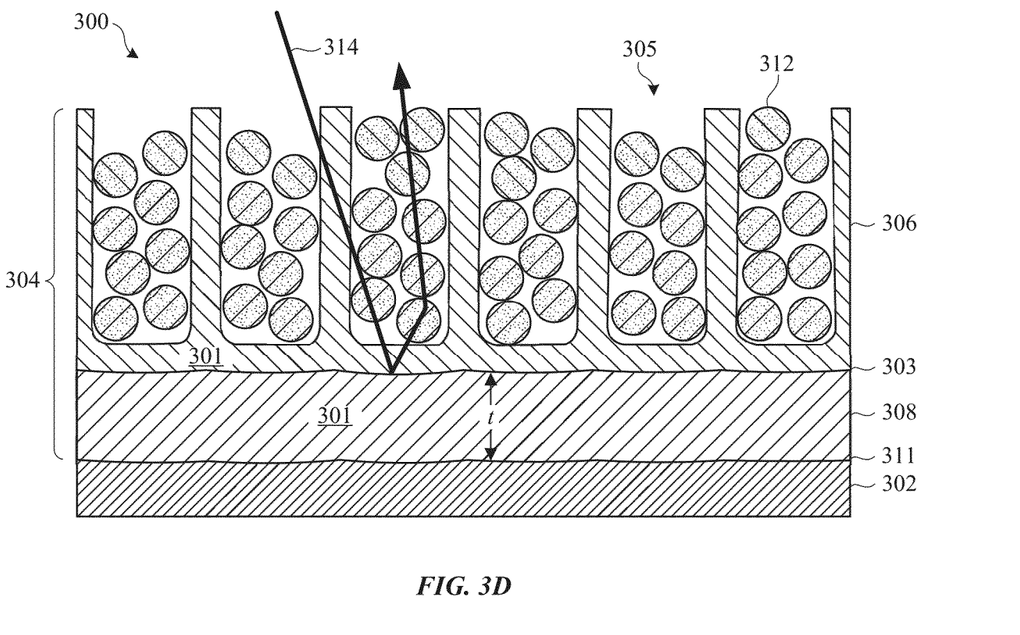

FIG. 3D shows part 300 after colorant particles 312 are deposited within pores 305. Since the scalloped or cup-shaped geometry of interface surface 303 has been attenuated and flattened, incident light, which would previously have been trapped within anodic film 304, reflects off interface surface 303 and onto colorant particles 312. To illustrate, light ray 314 that is incident on anodic film 304 can enter porous layer 306, reflect off interface surface 303 onto colorant particle 312, and a portion of light ray 314 that is not absorbed by colorant particle 312 is reflected out of anodic film 304 where it is perceived as color. That is, smoothed interface surface 303 is sufficiently smooth to direct light ray 314 toward colorant particles 312. If colorant particles 312 primarily reflect visible wavelengths of light corresponding to a blue color, colorant particles 312 will appear a blue color. If colorant particles 312 absorb substantially all visible wavelengths of light, colorant particles 312 will appear black. Similarly, if colorant particles 312 reflect substantially all visible wavelengths of light, colorant particles 312 will appear white. In some cases, colorant particles 312 include a mixture of different particles that reflect different wavelengths of light, resulting a unique perceived color resulting from a blend of different colored colorant particles 312.

It should be noted that it could be beneficial for substrate surface 311 to have a particular surface geometry in order to enhance the light absorption and reflection qualities of colorant particles 312. For example, substrate surface 311 having a smooth and highly reflective geometry can efficiently reflect incoming light to colorant particles 312, thereby increasing an apparent color saturation, similar to as described above with respect to a smooth interface surface 303. This may be important for bright colors such as white and brighter shades of red, blue, yellow, etc. However, for darker colors such as black or dark brown, a textured substrate surface 311 that traps light may be more desirable. In these cases, substrate surface 311 can be textured, such as by a chemical etch process prior to anodizing.

Colorant particles 312 can be made of any suitable color-imparting material or combination of materials, including organic or inorganic dyes, metals or combinations of dyes and metals. In some embodiments, colorant particles 312 are pigment particles that are generally larger than organic dye particles. For example, titanium oxide ($TiO_2$) pigment, which can be used to create a white appearing anodic film 304, can be available in particle sizes having a diameter of about 50 to 60 nanometers. This can be compared to many organic dyes that have a particle diameter of less than about 10 nanometers. Carbon black pigment, which can be used to create a black appearing anodic film 304, can be available in particle sizes having a diameter of about 70 to 80 nanometers. Other pigments, such as blue, red and yellow pigments, can have a particle diameter of about 50 to 100 nanometers.

Colorant particles 312 can be deposited within pores 305 using any suitable technique, and can depend on the type of colorant particles 312. Pigments are a typically suspended in a solution and infused within pores 305 by immersing or dipping part 300 within the pigment suspension. In some embodiments, the pigment particles are suspended in an aqueous solution. The concentration of pigment and the pH of the pigment suspension can vary depending upon the type of pigment used. In some embodiments, the concentration is between about 5% and 40% by weight. In one embodiment where titanium oxide particles are used, the pH of the pigment suspension is about 2. In one embodiment where carbon black particles are used, the pH of the pigment suspension is about 6. In one embodiment where blue, red and/or yellow particles are used, the pH of the pigment suspension is between about 2 and 11.

After the pigment particles are sufficiently infused within pores 305, part 300 is removed from the solution and either allowed to dry naturally under ambient conditions or an accelerated drying process is utilized, such as by directing heated air at part 300 or placing part 300 in an oven. Removing the moisture can cause the pigment particles to gather and clump together, resulting in agglomerated pigment particles having diameters larger than that of individual pigment particles. These agglomerated pigment particles can have diameters of about 50 nanometers or more, in some embodiments about 75 nanometers or more. Because of their larger sizes, the agglomerated pigment particles can result in an even greater perceived coloration of anodic film 304. In particular, anodic film 304 can have a more opaque appearance compared to the appearance of anodic film 304 prior to drying.

One of the advantages of using pigment particles over organic dye particles is that the larger pigment particles can result in a richer, more saturated appearance. The optional pore widening process described above with reference to FIG. 3B may be necessary in order to fit and adequate amount of the larger pigment particles within pores 305. In some embodiments, the amount of pigment, or any colorant particles 312, incorporated within anodic film 304 is measured by weight % relative to the anodic film 304. Since the weight % of colorant particles 312 can be proportional to an amount of perceived color saturation, this measurement can be used to predict how saturated and opaque anodic film 304 will appear. In a particular embodiment where titanium oxide pigment particles are used, the weight % of titanium oxide particles is greater than about 1.0 weight %—in some embodiments between about 1.5 weight % and about 5.0 weight %. In some embodiments, the weight % of the titanium oxide particles is between about 1.5 weight % and about 30 weight %.

Another advantage in using certain pigment particles (e.g., titanium oxide and carbon black) over conventional organic dyes is the organic dyes can be susceptible to fading when exposed to ultraviolet (UV) light. In contrast, pigments such as titanium oxide and carbon black are generally resistant to UV fading.

As described above, thickness t of barrier layer can be tuned to create light interference effects that can add a particular hue to anodic film 304. For example, it may be difficult to achieve a pure white color for anodic film 304 due to an inherent yellow hue of metal oxide material 301. Thus, thickness t of barrier layer 308 can be tuned to have a thickness sufficient to reflect blue wavelengths of light by interference coloring effects. The interference coloring does not generally provide a strong coloring effect, but rather a hue or tint to the overall appearance of anodic film 304. Thus, barrier layer 308 that provides a blue hue can counterbalance a yellow hue of metal oxide material 301, resulting in a more color neutral appearance. In this way, a pure white appearance for anodic film 304 can be achieved. In some embodiments, a final color of anodic film 304 is measured and characterized using a CIE 1976 L*a*b* color space model measurements, which is described in detail in application Ser. No. 14/312,502.

Figure 4:
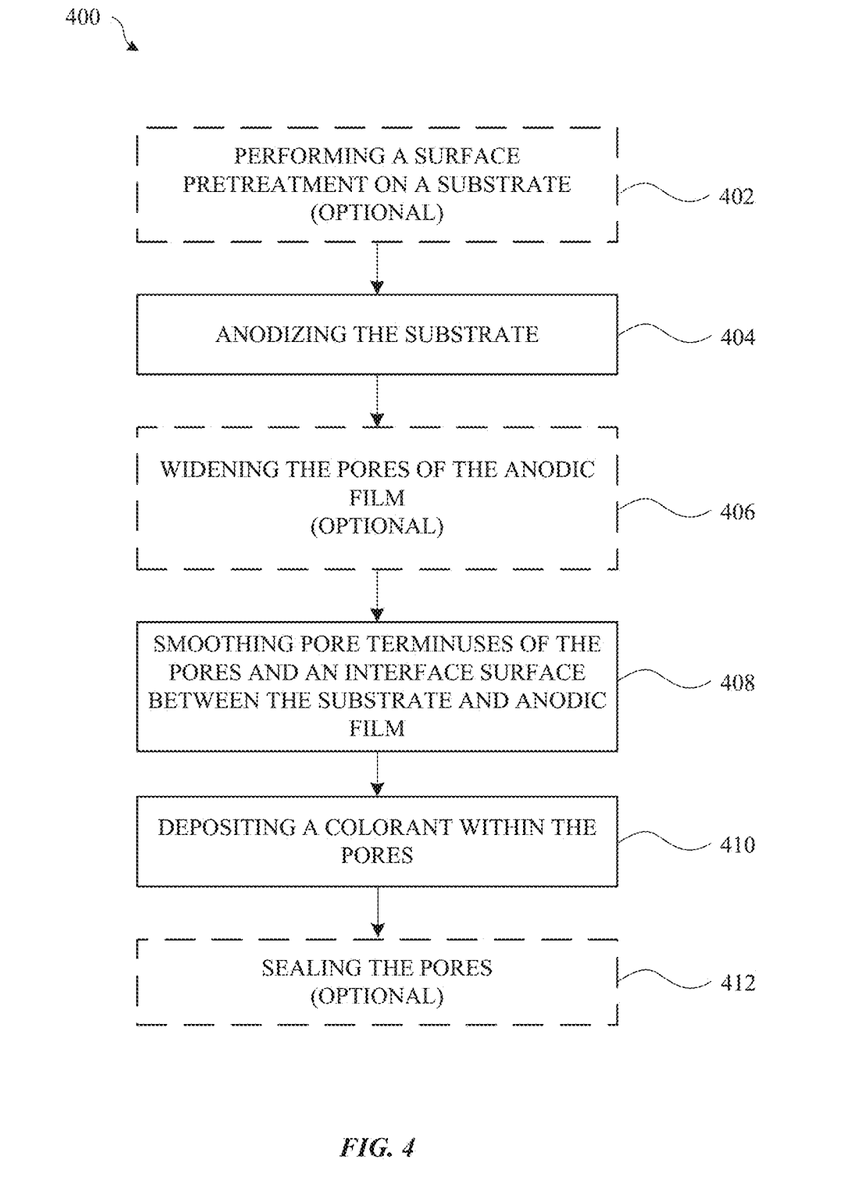
FIG. 4 shows a flowchart indicating a process for forming and coloring an anodic film in accordance with some embodiments.

FIG. 4 shows flowchart 400 indicating a process for forming and coloring an anodic film in accordance with some embodiments. At 402, a surface pretreatment is optionally performed on a metal substrate. The surface treatment can be a polishing process that creates a mirror polished substrate surface, corresponding to a very uniform surface profile. In other embodiments, the surface treatment is an etching process that creates a textured surface that can have a matte appearance. Suitable etching processes include an alkaline etch, where the substrate is exposed to an alkaline solution (e.g., NaOH) for a predetermined time period for creating a desired texture. Acidic etching solutions (e.g., $NH_4HF_2$) can also be used. Polishing techniques can include chemical polishing, which involves exposing the metal substrate to sulfuric acid and/or phosphoric acid solutions. In some embodiments, the polishing includes one or more mechanical polishing processes. In some embodiments where a final white or other bright appearance to an anodic film is desired, the substrate is preferably polished rather than etched in order to create an underlying light reflective substrate surface. In other embodiments, where a dark color or shade is desired, the substrate can be etched in order to purposely create an underlying light trap that traps incoming light.

At 404, the substrate is anodized. In some embodiments, the anodizing is performed in a phosphoric acid or oxalic acid solution, which can generally form wider pores than sulfuric anodizing processes. In a particular embodiment, a phosphoric acid anodizing process using a voltage of between about 80 and 100 is used to form an anodic film having a target thickness of about 10 micrometers. In some embodiments, an oxalic acid anodizing process using a voltage of between about 20 and 120 is used. During the anodizing process, an anodic film having a porous layer and a barrier layer is formed.

At 406, the pores of the porous layer are optionally widened in order to accommodate more colorant in a subsequent colorant infusing process. The process can include an electrolytic process within an acidic bath with a relatively weak applied voltage. The resultant anodic film has a pore diameter that is greater than the pore diameter prior to the pore widening process. The pore widening process may be more beneficial for those coloring process that include larger pigment particles.

At 408, the interface surface of the barrier layer positioned between the anodic film and the substrate is smoothed in order to remove a scalloped shape of the interface surface. The interface smoothing process can involve exposing the substrate to an anodic process, whereby the substrate is immersed in an electrolytic solution that promotes metal oxide material grown without significant dissolution of metal oxide material. In some embodiments, the solution contains sodium borate, boric acid or tartaric acid solution. In some embodiments, the tartaric acid is added to a sodium borate solution or boric acid solution. In some embodiments, one or more of the following chemicals are be used in solution for the barrier layer smoothing electrolytic process: $Na_2B_4O_5(OH)_4 \cdot 8H_2O$ (borax), $H_3BO_3$ (boric acid), $(NH_4)_2O \cdot 5B_2O_3 \cdot 8H_2O$ (Ammonium pentaborate octahydrate), $(NH_4)_2B_4O_7 \cdot 4H_2O$ (ammonium tetraborate tetrahydrate), $C_6H_{10}O_4$ (hexanedioic acid), $C_6H_{16}N_2O_4$ (ammonium adipate), $(NH_4)_2C_4H_4O_6$ (ammonium tartrate), $C_6H_8O_7$ (citric acid), $C_4H_4O_4$ (maleic acid), $C_2H_4O_3$ (glycolic acid), $C_6H_4(COOH)_2$ (phthalic acid), $Na_2CO_3$ (sodium carbonate), $[SiO_x(OH)_{4-2x}]_n$ (silicic acid), $H_3PO_4$ (phosphoric acid), $H_3NSO_3$ (sulfamic acid), $H_2SO_4$ (sulfuric acid), and $(COOH)_2$ (oxalic acid).

In some embodiments, the anodic film will have residues of one or more of these chemicals after the barrier layer smoothing operation is complete, and thus can be one method of detecting whether such a barrier layer smoothing operation was performed. For example, presence of borax or boric acid residues may persist within the anodic film, which can be detected by chemical analysis of the anodic film.

The applied voltage of the barrier layer electrolyzing process can vary depending on a desired amount of smoothing and/or a desired final thickness of the barrier layer. In some embodiments, the applied voltage is greater than about 50 volts. In some embodiments, the applied voltage is between about 50 and 400 volts. In some embodiments, a final thickness of the barrier layer is chosen to create a predetermined color hue by light interference effects.

At 410, a colorant is deposited within the pores of the anodic film. The colorant imparts a color to the anodic film by absorbing certain wavelengths of visible light and reflecting other wavelengths of visible light. In some embodiments, the colorant includes an organic dye or metal. In some embodiments, the colorant includes pigment particles having a particle diameter greater than about 50 nanometers. In some embodiments, the colorant includes a combination of pigment, dye and/or metal colorant. The chemical composition of the colorant will depend, in part, on a desired final color of the anodic film. The smoothed interface surface of the barrier layer that underlies the porous layer of the anodic film acts to reflect light onto the colorant, thereby enhancing the coloring effect of the colorant. In particular, more the more reflective interface surface can cause more light to be absorbed and reflected by the colorant.

The type of colorant will depend on a desired final color of the anodic film. In some embodiments, a carbon black colorant is used to impart a black color to the anodic film with a target L* value of about 30 or less, where L* corresponds to an amount of lightness measured using CIE D65 color space standards. In some embodiments where a desired color of the anodic film is white (e.g., using $TiO_2$ pigment), measurement using standard CIE D65 color space techniques may effective to some extent but may be limited in other aspects. For example, an L* value can be used to determine an amount of lightness of the anodic film (i.e., the amount of light reflected by the anodic film and underlying substrate). However, L* value alone may not be an accurate indication of an amount of white color saturation. That is, high L* values can also be attributed by a highly reflective underlying substrate surface, but the part will appear to have some silver or greyness from the underlying substrate and may not appear as a saturated white color. Another method of measuring whiteness of an anodized part is using ASTM E313 standard practice, which is used to calculate yellowness and whiteness indices. A further way to measure whiteness is by using human visual inspection, where colorized anodized parts are visually compared to one another for perceived whiteness and color saturation.

At 412, the pores of the anodic film are optionally sealed using a sealing process. The sealing process can lock in the colorant and provide a more durable anodic film. Any suitable sealing process can be used. In a particular embodiment, a sealing solution containing Okuno Chemical H298 (manufactured by Okuno Chemical Industries Co., Ltd., based in Japan).

Figure 5A:
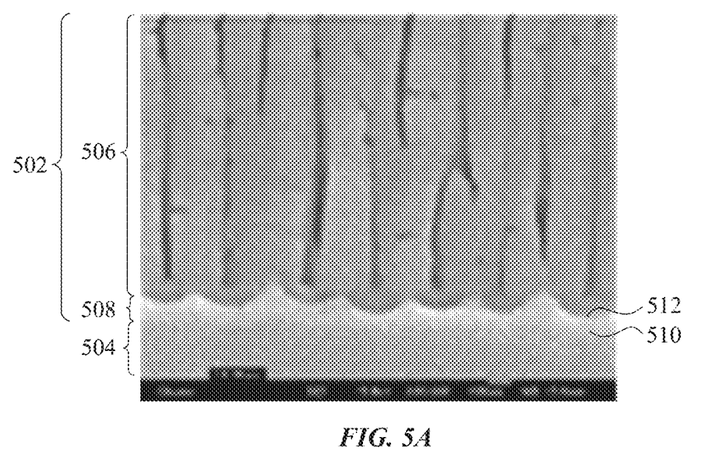
FIGS. 5A and 5B show SEM images of cross sections of an anodized part before and after a barrier layer smoothing process in accordance with some embodiments.
Figure 5B:
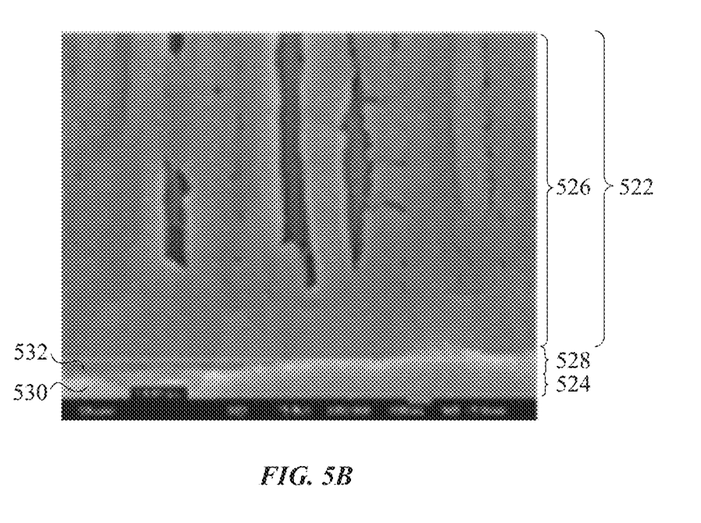

FIGS. 5A and 5B show SEM images of cross sections of anodic film samples prior to and after exposure to a barrier smoothing process in accordance with some embodiments. FIG. 5A shows anodic film 502, positioned on substrate 504, after an anodizing process but prior to a barrier layer smoothing process. Anodic film 502 includes porous layer 506 and barrier layer 508. As shown, interface surface 510 of barrier layer 508 and pore terminuses 512 have scalloped shapes, with each scallop feature corresponding to a hemispherical cup-like feature in three-dimensions. This scalloped geometry can cause incident light to become trapped within anodic film 502. Barrier layer 508 has a thickness of about 106 nanometers, as measured by the SEM image.

FIG. 5B shows anodic film 522, positioned on substrate 524, after a barrier layer smoothing process. Anodic film 522 includes porous layer 526 and barrier layer 528. As shown interface surface 530 of barrier layer 528 and pore terminuses 532 are smooth and relatively flat compared to the curved, scalloped geometry prior to the smoothing process (FIG. 5A). Barrier layer 528 has a thickness of about 484 nanometers, indicating that the smoothing process is associated with a thickening of barrier layer 508.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An enclosure for an electronic device, the enclosure comprising:
    a metal substrate;
    an anodic layer corresponding to an exterior surface of the enclosure and overlaying the metal substrate, the anodic layer defining a pore that is infused with an individual pigment particle having a size of at least 20 nanometers; and
    a barrier layer positioned between the anodic layer and the metal substrate, the barrier layer having a thickness of at least 150 nanometers, and defining a substantially flat interface surface adjacent to the anodic layer that reflects light incident on the interface surface directly onto the individual pigment particle.

2. The enclosure of claim 1, wherein the thickness of the barrier layer is between 150 nanometers and 500 nanometers.

3. The enclosure of claim 1, wherein the pigment particle comprises titanium oxide.

4. The enclosure of claim 3, wherein a weight % of titanium oxide within the anodic layer is greater than 1.0 weight %.

5. The enclosure of claim 1, wherein the anodic layer includes at least one of borax acid residue or boric acid residue.

6. The enclosure of claim 1, wherein the anodic layer has an L* value of 30 or less.

7. The enclosure of claim 1, wherein the pore is sealed.

* * * * *